(12) United States Patent
Sung

(10) Patent No.: US 8,222,732 B2
(45) Date of Patent: Jul. 17, 2012

(54) HEAT SPREADER HAVING SINGLE LAYER OF DIAMOND PARTICLES AND ASSOCIATED METHODS

(75) Inventor: Chien-Min Sung, Tansui (TW)

(73) Assignee: RiteDia Corporation, Hsin Chu Industrial Park (TW)

( * ) Notice: Subject to any disclaimer, the term of this patent is extended or adjusted under 35 U.S.C. 154(b) by 17 days.

(21) Appl. No.: 12/873,117

(22) Filed: Aug. 31, 2010

(65) Prior Publication Data

US 2011/0056672 A1    Mar. 10, 2011

Related U.S. Application Data

(63) Continuation of application No. 11/820,485, filed on Jun. 18, 2007, now Pat. No. 7,791,188.

(51) Int. Cl.
*H01L 23/34* (2006.01)
*H01L 23/10* (2006.01)

(52) U.S. Cl. .. 257/713; 257/706; 257/712; 257/E23.111

(58) Field of Classification Search ................. 257/706, 257/712, 713, E23.111
See application file for complete search history.

(56) References Cited

U.S. PATENT DOCUMENTS

| | | |
|---|---|---|
| 1,382,080 A | 6/1921 | Vereschagin et al. |
| 3,574,580 A | 4/1971 | Stromberg et al. |
| 3,678,995 A | 7/1972 | Collard |
| 3,828,848 A | 8/1974 | Custers et al. |
| 3,829,544 A | 8/1974 | Hall |
| 3,872,496 A | 3/1975 | Potter |
| 3,912,500 A | 10/1975 | Vereschagin et al. |
| 3,913,280 A | 10/1975 | Hall |
| 3,915,605 A | 10/1975 | Vereschagin et al. |
| 3,949,263 A | 4/1976 | Harper |
| 4,124,401 A | 11/1978 | Lee et al. |
| 4,224,380 A | 9/1980 | Bovenkerk et al. |
| 4,231,195 A | 11/1980 | DeVries et al. |
| 4,378,233 A | 3/1983 | Carver |
| 4,425,195 A | 1/1984 | Papanicolaou |

(Continued)

FOREIGN PATENT DOCUMENTS

EP   0391418   4/1990

(Continued)

OTHER PUBLICATIONS

Bonhaus et al.; Optimizing the Cooling of High Power GaAs-Laser Diodes by Using Diamond Heat Spreaders; http://www.fernuni-hagen.de/LGBE/papers/opcool.html; pp. 1-2; as accessed on May 11, 2005.

(Continued)

*Primary Examiner* — Nitin Parekh
(74) *Attorney, Agent, or Firm* — Thorpe North & Western LLP

(57) ABSTRACT

A heat spreader is presented which can provide effective thermal management in a cost effective manner. The heat spreader includes a plurality of diamond particles arranged in a single layer surrounded by a metallic mass. The metallic mass cements the diamond particles together. The layer of diamond particles is a single particle thick. Besides the single layer of diamond particles, the metallic mass has substantially no other diamond particles therein. A thermal management system including a heat source and a heat spreader is also presented, along with methods for making and methods for use of such heat spreaders.

25 Claims, 5 Drawing Sheets

U.S. PATENT DOCUMENTS

| | | | |
|---|---|---|---|
| 4,518,659 A | 5/1985 | Gigl et al. | |
| 4,534,773 A | 8/1985 | Phaal et al. | |
| 4,576,224 A | 3/1986 | Eaton et al. | |
| 4,617,181 A | 10/1986 | Yazu et al. | |
| 4,649,992 A | 3/1987 | Geen et al. | |
| 4,664,705 A | 5/1987 | Horton et al. | |
| 4,948,388 A | 8/1990 | Ringwood | |
| 5,008,737 A | 4/1991 | Burnham et al. | |
| 5,045,972 A | 9/1991 | Supan et al. | |
| 5,070,936 A | 12/1991 | Carroll et al. | |
| 5,094,985 A | 3/1992 | Kijima et al. | |
| 5,096,465 A | 3/1992 | Chen et al. | |
| 5,120,495 A | 6/1992 | Supan et al. | |
| 5,130,771 A | 7/1992 | Burnham et al. | |
| 5,224,017 A | 6/1993 | Martin | |
| 5,382,314 A | 1/1995 | Jin | |
| 5,542,471 A | 8/1996 | Dickinson | |
| 5,614,320 A | 3/1997 | Beane et al. | |
| 5,642,779 A | 7/1997 | Yamamoto et al. | |
| 5,660,894 A | 8/1997 | Chen et al. | |
| 5,672,548 A | 9/1997 | Culnane et al. | |
| 5,696,665 A | 12/1997 | Nagy | |
| 5,719,441 A | 2/1998 | Larimer | |
| 5,783,316 A | 7/1998 | Colella et al. | |
| 5,785,799 A | 7/1998 | Culnane et al. | |
| 5,786,075 A | 7/1998 | Mishuku et al. | |
| 5,812,570 A | 9/1998 | Spaeth | |
| 5,834,337 A | 11/1998 | Unger et al. | |
| 5,895,972 A | 4/1999 | Paniccia | |
| 5,981,310 A * | 11/1999 | DiGiacomo et al. | 438/106 |
| 5,982,623 A | 11/1999 | Matsuo et al. | |
| 6,031,285 A | 2/2000 | Nishibayashi | |
| 6,039,641 A | 3/2000 | Sung | |
| 6,101,715 A * | 8/2000 | Fuesser et al. | 29/890.03 |
| 6,167,948 B1 | 1/2001 | Thomas | |
| 6,171,691 B1 | 1/2001 | Nishibayashi | |
| 6,193,770 B1 | 2/2001 | Sung | |
| 6,215,661 B1 | 4/2001 | Messenger et al. | |
| 6,238,454 B1 | 5/2001 | Polese et al. | |
| 6,264,882 B1 | 7/2001 | Colella et al. | |
| 6,270,848 B1 | 8/2001 | Nishibayashi | |
| 6,280,496 B1 | 8/2001 | Kawai et al. | |
| 6,284,315 B1 | 9/2001 | Tzeng | |
| 6,335,863 B1 | 1/2002 | Yamamoto et al. | |
| 6,337,513 B1 | 1/2002 | Clevenger et al. | |
| 6,361,857 B1 | 3/2002 | Saito et al. | |
| 6,369,455 B1 | 4/2002 | Ho et al. | |
| 6,390,181 B1 | 5/2002 | Hall et al. | |
| 6,407,922 B1 | 6/2002 | Eckblad et al. | |
| 6,413,589 B1 | 7/2002 | Li | |
| 6,447,852 B1 | 9/2002 | Gordeev et al. | |
| 6,448,642 B1 | 9/2002 | Bewley et al. | |
| 6,482,248 B1 | 11/2002 | Holloway | |
| 6,517,221 B1 | 2/2003 | Xie | |
| 6,534,792 B1 | 3/2003 | Schaffer | |
| 6,538,892 B2 | 3/2003 | Smalc | |
| 6,541,115 B2 | 4/2003 | Pender et al. | |
| 6,653,730 B2 | 11/2003 | Chrysler et al. | |
| 6,706,562 B2 | 3/2004 | Mahajan et al. | |
| 6,709,747 B1 | 3/2004 | Gordeev et al. | |
| 6,758,263 B2 | 7/2004 | Krassowski et al. | |
| 6,837,935 B2 | 1/2005 | Meguro et al. | |
| 6,914,025 B2 | 7/2005 | Ekstrom et al. | |
| 6,984,888 B2 | 1/2006 | Sung | |
| 6,987,318 B2 | 1/2006 | Sung | |
| 7,005,320 B2 | 2/2006 | Kwon | |
| 7,008,672 B2 | 3/2006 | Gordeev et al. | |
| 7,014,093 B2 | 3/2006 | Houle et al. | |
| 7,067,903 B2 | 6/2006 | Tachibana et al. | |
| 7,173,334 B2 | 2/2007 | Sung | |
| 7,268,011 B2 | 9/2007 | Sung | |
| 7,384,821 B2 | 6/2008 | Sung | |
| 7,791,188 B2 | 9/2010 | Sung | |
| 2001/0031360 A1 | 10/2001 | Rudder et al. | |
| 2002/0023733 A1 | 2/2002 | Hall et al. | |
| 2003/0047814 A1 | 3/2003 | Kwon | |
| 2003/0168731 A1 | 9/2003 | Matayabas et al. | |
| 2004/0053039 A1 | 3/2004 | Ekstrom et al. | |
| 2004/0183172 A1 | 9/2004 | Saito et al. | |
| 2004/0238946 A1 * | 12/2004 | Tachibana et al. | 257/706 |
| 2005/0019114 A1 * | 1/2005 | Sung | 407/119 |
| 2005/0025973 A1 | 2/2005 | Slutz et al. | |
| 2005/0051891 A1 | 3/2005 | Yoshida et al. | |
| 2005/0189647 A1 | 9/2005 | Sung | |
| 2005/0231983 A1 | 10/2005 | Dahm | |
| 2005/0250250 A1 | 11/2005 | Sung | |
| 2005/0276979 A1 | 12/2005 | Slutz et al. | |
| 2006/0091532 A1 | 5/2006 | Suing | |
| 2006/0113546 A1 | 6/2006 | Sung | |
| 2006/0138455 A1 | 6/2006 | Saxler | |
| 2006/0185836 A1 | 8/2006 | Garner | |
| 2007/0075420 A1 * | 4/2007 | Lu et al. | 257/720 |
| 2007/0170581 A1 | 7/2007 | Sung | |
| 2007/0177367 A1 * | 8/2007 | Bailey et al. | 361/808 |
| 2007/0298537 A1 | 12/2007 | Sung | |
| 2008/0019098 A1 | 1/2008 | Sung | |
| 2008/0029883 A1 | 2/2008 | Sung | |
| 2009/0166854 A1 * | 7/2009 | Jewram et al. | 257/713 |
| 2011/0044004 A1 * | 2/2011 | Garosshen et al. | 361/709 |

FOREIGN PATENT DOCUMENTS

| | | |
|---|---|---|
| EP | 0898310 | 2/1999 |
| EP | 0991121 | 4/2000 |
| EP | 1432029 | 6/2004 |
| EP | 1452614 | 9/2004 |
| GB | 1382080 | 1/1975 |
| JP | 62-025442 | 2/1987 |
| JP | 62-249462 | 10/1987 |
| JP | 62-274034 | 11/1987 |
| JP | 3-9552 | 1/1991 |
| JP | 04-144157 | 5/1992 |
| JP | 4-231436 | 8/1992 |
| JP | 5-291444 | 11/1993 |
| JP | 5-347370 | 12/1993 |
| JP | 06015571 | 1/1994 |
| JP | 07-142652 | 6/1995 |
| JP | 08-100261 | 4/1996 |
| JP | 0912362 | 12/1997 |
| JP | 09312362 | 12/1997 |
| JP | 10223812 | 8/1998 |
| JP | 10-230465 | 9/1998 |
| JP | 11067991 | 3/1999 |
| JP | 2000/303126 | 10/2000 |
| JP | 2004146413 | 5/2004 |
| JP | 2004175626 | 6/2004 |
| WO | WO 00/13823 | 3/2000 |
| WO | WO 01/48816 | 7/2001 |
| WO | WO 02/42240 | 5/2002 |
| WO | WO 03/040420 | 5/2003 |
| WO | WO 2004/034466 | 4/2004 |

OTHER PUBLICATIONS

Butler; Chemical Vapor Deposited Diamond;, Maturity and Diversity; The Electrochemical Society Interface; Sprin 2003; pp. 22-26.

Chen et al.; Effects of Nucleation Methods on Characteristics of Low-Temperature Deposited Ultrananocrystalline Diamond; Abstract Only; htto:nano.anl.gov/ADC2005/pdfs/abstracts/poster2/ 9-8_ADC0037_Lin.pdf; as accessed on May 2005; pp. 1-2.

Sun et al.; Fabrication & Characterization of Diamond/Copper Composites for Thermal Management Substrate Applications; Materials Science & Engineering B41; 1996; pp. 261-266.

Hall; Sintered Diamonds; Science; Aug. 28, 1970; vol. 169; pp. 1-2.

Horton et al.; Sintered Diamond; International Industrial Diamond Association Symposium; Washington, D.C.;1974.

Huang et al.; Synthesis of Large-Area, Thick, Uniform, Smooth, Ultrananocrystalline Diamond Films by Microwave Plasma-Assisted Chemical Vapor Deposition; Abstract Only; http://nano.anl. gov/ADC2005/pdfs/abstracts/pster1/9-1_ad; as accessed on May 2005; pp. 1-2.

Liu et al.; Nucleation Kinetics of Diamond on Carbide-Forming Substrates During CVD-I Transient Nucleation Stage; Fourth International Symposium on Diamond Materials; Reno, NV; May 21-26, 1995; pp. 1-16.

Liu et al.; Studies on Nucleation Process in Diamond CVD: An Overview of Recent Development; Diamond and Related Materials; Sep. 1995; vol. 4, No. 10; pp. 1-28.

May et al; Diamond Thin Films: A 21$^{st}$-Century Material; Phil. Trans. R. Soc. Lond., 2000; vol. 55 pp. 473-495.

Patsil et al; Microwave Plasma Deposition of Diamond Like Carbon Coatings; PRAAM—Journal of Physics; Nov. & Dec. 2000; vol. 55, Nos. 5 and 6 pp. 933-939.

Piazza et al.; Effects of Nano- and Micro-Crystalline Seeds on the Growth of Nano- and Micro-Crystalline Diamond Thin Films; Abstract only; http://nano.anl.gov/ADC2005/pdfs/abstracts/poster29-10_ADC00071_Morell.pdf; as accessed on May 2005; pp. 1-2.

Piazza et al.; Micro- and Nano-Crystalline Diamond Film Synthesis at Substrate Temperatures Sub 400° C.; Abstract only; http://nano.anl.gov/ADC2005/pdfs/abstracts/session9/ADC0069_Morell.pdf; as accessed on May 2005; pp. 1-2.

Pope et al.; Sintered Diamond: Its Possible Use as a High Thermal Conductivity Semiconduction Device Substrate; Proc. 4$^{th}$ International Conference on High Pressure (Airapt); 1974; Kyoto Japan; pp. 1-5.

Rebello et al.; Diamond Growth by Laser-Driven Reactions in a CO/H2 Mixture; Appl. Phys. Lett; Feb. 22, 1993; pp. 899-901, vol. 62, No. 8.

Rebello et al.; Diamond Growth from a CO/CH4 Mixture by Laser Excitation of CO: Laser Excited Chemical Vapor Deposition; J. Appl. Phys.; Aug. 1992; vol. 72 No. 3; pp. 1133-1136.

Semikina et al; Liquid Carbon Sources for Deposition of Nanostructural Diamond; http://nano.anl.gov/ADC2005/pdfs/abstracts/poster1/9-13_ADC0010_Takagi.pdf; as accessed on May 2005; pp. 1-2.

Sun et al; Fabrication & Characterization of Diamond/Copper Composites for Thermal Management Substrate Applications; Abstract Only; Materials Science & Engineering B41; 1996; 1 page.

* cited by examiner

HEAT SPREADER HAVING SINGLE LAYER OF DIAMOND PARTICLES AND ASSOCIATED METHODS

PRIORITY DATA

This application is a continuation of U.S. patent application Ser. No. 11/820,485, filed Jun. 18, 2007 now U.S. Pat. No. 7,791,188, which is incorporated herein by reference.

FIELD OF THE INVENTION

The present invention relates to carbonaceous composite devices and methods for conducting or absorbing heat away from a heat source. Accordingly, the present invention involves the fields of chemistry, physics, semiconductor technology, and materials science.

BACKGROUND OF THE INVENTION

Progress in the semiconductor industry has been following the trend of Moore's Law that was proposed in 1965 by then Intel's cofounder Gordon Moore. This trend requires that the capability of integrated circuits (IC) or, in general, semiconductor chips double every 18 months.

Along with such advances comes various design challenges. One of the often overlooked challenges is that of heat dissipation. Most often, this phase of design is neglected or added as a last minute design before the components are produced. According to the second law of thermodynamics, the more work that is performed in a closed system, the higher entropy it will attain. With the increasing power of a central processing unit (CPU), the larger flow of electrons produces a greater amount of heat. Therefore, in order to prevent the circuitry from shorting or burning out, the heat resulting from the increase in entropy must be removed. Some state-of-the-art CPU's have a power of about 70 watts (W) or more. For example, a CPU made with 0.13 micrometer technology may exceed 100 watts. Current methods of heat dissipation, such as by using metal (e.g., Al or Cu) fin radiators, and water evaporation heat pipes, will be inadequate to sufficiently cool future generations of CPUs.

Recently, ceramic heat spreaders (e.g., AlN) and metal matrix composite heat spreaders (e.g., SiC/Al) have been used to cope with the increasing amounts of heat generation. However, such materials have a thermal conductivity that is no greater than that of Cu, hence, their ability to dissipate heat from semiconductor chips is limited.

A typical semiconductor chip contains closely packed metal conductors (e.g., Al, Cu) and ceramic insulators (e.g., oxide, nitride). The thermal expansion of metal is typically 5-10 times that of ceramics. When the chip is heated to above 60° C., the mismatch of thermal expansions between metal and ceramics can create microcracks. The repeated cycling of temperature tends to aggravate the damage to the chip. As a result, the performance of the semiconductor will deteriorate. Moreover, when temperatures reach more than 90° C., the semiconductor portion of the chip may become a conductor so the function of the chip is lost. In addition, the circuitry may be damaged and the semiconductor is no longer usable (i.e. becomes "burned out"). Thus, in order to maintain the performance of the semiconductor, its temperature must be kept below a threshold level (e.g., 90° C.).

A conventional method of heat dissipation is to contact the semiconductor with a metal heat sink. A typical heat sink is made of aluminum that contains radiating fins. These fins are attached to a fan. Heat from the chip will flow to the aluminum base and will be transmitted to the radiating fins and carried away by the circulated air via convection. Heat sinks are therefore often designed to have a high heat capacity to act as a reservoir to remove heat from the heat source.

Alternatively, a heat pipe may be connected between the heat sink and a radiator that is located in a separated location. The heat pipe contains water vapor that is sealed in a vacuum tube. The moisture will be vaporized at the heat sink and condensed at the radiator. The condensed water will flow back to the heat sink by the wick action of a porous medium (e.g., copper powder). Hence, the heat of a semiconductor chip is carried away by evaporating water and removed at the radiator by condensing water.

Although heat pipes and heat plates may remove heat very efficiently, the complex vacuum chambers and sophisticated capillary systems prevent designs small enough to dissipate heat directly from a semiconductor component. As a result, these methods are generally limited to transferring heat from a larger heat source, e.g., a heat sink. Thus, removing heat via conduction from an electronic component is a continuing area of research in the industry.

One promising alternative that has been explored for use in heat spreaders is diamond-containing materials. Diamond can carry away heat much faster than any other material. The thermal conductivity of diamond at room temperature (about 2000 W/mK) is five times higher than copper (about 400 W/mK) and eight times that of aluminum (250 W/mK), the two fastest metal heat conductors commonly used. Moreover, the thermal diffusivity of diamond (12.7 cm$^2$/sec) is eleven times that of copper (1.17 cm$^2$/sec) or aluminum (0.971 cm$^2$/sec). The ability for diamond to carry away heat without storing it makes diamond an ideal heat spreader. In contrast to heat sinks, a heat spreader acts to quickly conduct heat away from the heat source without storing it. Table 1 shows various thermal properties of several materials as compared to diamond (values provided at 300 K).

TABLE 1

| Material | Thermal Conductivity (W/mK) | Heat Capacity (J/cm$^3$ K) | Thermal Expansion (ppm/K) |
| --- | --- | --- | --- |
| Copper | 401 | 3.44 | 16.4 |
| Aluminum | 237 | 2.44 | 24.5 |
| Molybdenum | 138 | 2.57 | 47.5 |
| Gold | 317 | 2.49 | 14.5 |
| Silver | 429 | 2.47 | 18.7 |
| Tungsten Carbide | 95 | 2.95 | 5.7 |
| Silicon | 148 | 1.66 | 2.6 |
| Diamond (IIa) | 2,300 | 1.78 | 1.4 |

In addition, the thermal expansion coefficient of diamond is one of the lowest of all materials. The low thermal expansion of diamond makes joining it with low thermally expanding silicon semiconductor much easier. Hence, the stress at the joining interface can be minimized.

In recent years diamond heat spreaders have been used to dissipate heat from high power laser diodes, such as that used by laser diodes to boost the light energy in optical fibers. However, large area diamonds are very expensive; hence, diamond has not been commercially used to spread the heat generated by CPUs. In order for diamond to be used as a heat spreader, its surface must be polished so it can make an intimate contact with the semiconductor chip. Moreover, its surface may be metallized (e.g., by Ti/Pt/Au) to allow attachment to a conventional metal heat sink by brazing.

Many current diamond heat spreaders are made of diamond films formed by chemical vapor deposition (CVD).

One example of raw CVD diamond films are now sold at over $10/cm$^2$, and this price may be doubled when it is polished and metallized. This high price would prohibit diamond heat spreaders from being widely used except in those applications (e.g., high power laser diodes) where only a small area is required or no effective alternative heat spreaders are available. In addition to being expensive, CVD diamond films can only be grown at very slow rates (e.g., a few micrometers per hour); hence, these films seldom exceed a thickness of 1 mm (typically 0.3-0.5 mm). However, if the heating area of the chip is large (e.g., a CPU), it is preferable to have a thicker (e.g., 3 mm) heat spreader.

In addition to diamond products produced using CVD methods, attempts have been made to form heat spreaders using a mass of particulate diamond or "polycrystalline diamond" (PCD). Specific examples of such devices are found in U.S. Pat. No. 6,390,181, and U.S. Patent Application Publication No. 2002/0023733, each of which is incorporated herein by reference. Typically, a PCD product (or "compact") is formed by sintering diamond particles under high-pressure, high-temperature (HPHT) conditions to using cobalt as a sintering aid. Alternatively, silicon or its alloy can be used to cement diamond particles together, as described in U.S. Pat. Nos. 4,124,401 and 4,534,773. Diamond particles used in typical sintering processes have a particle size in the micron range. Thus, PCD compacts typically have extensive grain boundaries with a low conductivity second phase surrounding individual grains. Such PCD compacts are of limited use in the field of heat spreaders because of their limited physical capacity to transfer or conduct heat.

As such, cost effective systems and devices that are capable of effectively conducting heat away from a heat source, continue to be sought through ongoing research and development efforts.

SUMMARY OF THE INVENTION

Accordingly, the present invention provides heat spreaders that can be used to draw or conduct heat away from a heat source. In one aspect, a heat spreader includes a plurality of diamond particles arranged in a single layer and surrounded by a metallic mass. The single layer of diamond particles can be a single particle thick. The metallic mass can effectively cement the diamond particles and can be free of substantially all diamond particles besides those present in the single layer. In another variation of a heat spreader, a single layer of diamond particles can be a single layer thick, with each diamond particle in direct physical contact with another diamond particle. A metallic mass can cement the diamond particles together on at least one side of the heat spreader.

A thermal management system is also presented. The system includes a heat source and a heat spreader in contact with the heat source. The heat spreader can have a first and second side, oppositely located. The first side can have a lower thermal expansion and higher thermal conductivity than the second side. The single layer of cemented diamond particles in the heat spreader can affect such properties. The single layer of diamond particles can be a single particle thick. Furthermore, there can be substantially no other diamond particles in the heat spreader beyond those present in the single layer. The first side of the heat spreader can be closer to the heat source than the second side, thus allowing for better contact with the heat source, preferable long-term performance characteristics, and the ability to efficiently remove heat from the heat source.

Likewise, a method for transferring heat from a heat source includes drawing heat energy from a heat source into a diamond layer of a heat spreader. As with the previous embodiments, the heat spreader can include a single layer of diamond particles, which is a single particle thick. The heat energy can then be conveyed into a metallic mass that substantially surrounds and cements the diamond particles together. Once again, the metallic mass can contain substantially no diamond particles other than the diamond particles in the single layer.

A method of making a heat spreader consistent with the present invention is also disclosed. The method includes arranging a plurality of diamond particles in a single layer with a single particle thickness. The single layer can be encompassed with a metallic mass. Additionally, the mass can be substantially free of all other diamond particles.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

Figure 1A:
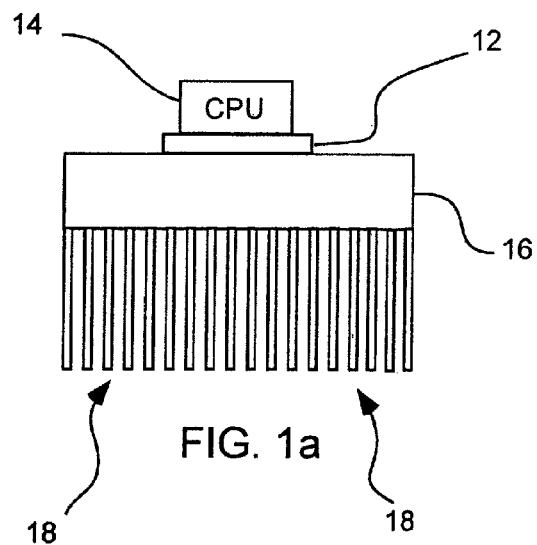
FIG. 1a is a schematic view of a heat spreader in thermal communication with a heat source and a heat sink in accordance with an embodiment of the present invention.

It will be understood that the above figures are merely for illustrative purposes in furthering an understanding of the invention. Further, the figures are not drawn to scale, thus dimensions, particle sizes, and other aspects may, and generally are, exaggerated to make illustrations thereof clearer. Therefore, departure can be made from the specific dimensions and aspects shown in the figures in order to produce the heat spreaders of the present invention.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an" and, "the" include plural referents unless the context clearly dictates otherwise. Thus, for example, reference to "a diamond particle" includes one or more of such particles, reference to "an interstitial material" includes reference to one or more of such materials, and reference to "the particle" includes reference to one or more of such particles.

Definitions

In describing and claiming the present invention, the following terminology will be used in accordance with the definitions set forth below.

As used herein, "particle" and "grit" may be used interchangeably, and as used herein in connection with diamond particles, refer to a particulate form of diamond. Such particles or grits may take a variety of shapes, including round, oblong, square, euhedral, etc., can be either single crystal or polycrystalline, and can have a number of specific mesh sizes. In a specific aspect, "particle" can comprise or consist essentially of polycrystalline diamonds of any shape, i.e. cube. As is known in the art, "mesh" refers to the number of holes per unit area as in the case of U.S. meshes. All mesh sizes referred to herein are U.S. mesh unless otherwise indicated. Further, mesh sizes are generally understood to indicate an average mesh size of a given collection of particles since each particle within a particular "mesh size" may actually vary over a small distribution of sizes.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, "heat spreader" refers to a material or composite article that distributes or conducts heat and transfers heat away from a heat source. Heat spreaders are distinct from heat sinks, which are used as a reservoir for heat to be held in, until it can be transferred away from the heat sink by another mechanism, whereas a heat spreader may not retain a significant amount of heat, but merely transfers heat away from a heat source.

As used herein, "heat source" refers to a device or object having an amount of thermal energy or heat that is greater than desired. Heat sources can include devices that produce heat as a byproduct of their operation, as well as objects that become heated to a temperature that is higher than desired by a transfer of heat thereto from another heat source.

As used herein, "chemical bond" and "chemical bonding" may be used interchangeably, and refer to a molecular bond that exerts an attractive force between atoms that is sufficiently strong to create a binary solid compound at an interface between the atoms.

As used herein, "infiltrating" refers to when a material is heated to its melting point and then flows as a liquid through the interstitial voids between particles.

As used herein, "sintering" refers to the joining of two or more individual particles to form a continuous solid mass. The process of sintering involves the consolidation of particles to at least partially eliminate voids between particles. Sintering of diamond particles generally requires ultrahigh pressures and the presence of a carbon solvent as a diamond sintering aid.

As used herein, "cementing" and "cemented" refers to a non-sintered state wherein particles are mechanically held in place by the surrounding material, e.g. metallic material(s).

The term "metallic" refers to both metals and metalloids. Metals include those compounds typically considered metals found within the transition metals, alkali and alkali earth metals. Examples of metals are Ag, Au, Cu, Al, and Fe. Metalloids include specifically Si, B, Ge, Sb, As, and Te. Metallic materials also include alloys or mixtures that include metallic materials. Such alloys or mixtures may further include additional additives. In the present invention, carbide formers and carbon wetting agents may be included as alloys or mixtures, but are not anticipated to be the only metallic component. Examples of such carbide formers are Sc, Y, Ti, Zr, Hf, V, Nb, Cr, Mo, Mn, Ta, W, and Tc. Examples of carbon wetting agents are Co, Ni, Mn, and Cr.

As used herein, "grade" refers to the quality of diamond particle. Higher grade indicates diamonds with fewer imperfections and inclusions. Synthetically-made diamonds are more likely than natural diamonds to include inclusions as a result of the manufacturing process. Diamonds with fewer imperfections and inclusions are better thermal conductors and therefore are preferably used in the present invention. Additionally, diamonds with imperfections and inclusions are more prone to damage under certain manufacturing conditions. Selecting diamonds of a higher grade indicates conscious selection of diamond particles beyond selection for such qualities as size, price, and/or shape. Higher grade diamonds represents at least one step above the lowest available grade diamond particles, and often represents more than one step above. Such increase in grade is generally indicated by an increase in price when compared to diamond particles of the same size. Examples of high or higher grade diamond particles include Diamond Innovations MBS-960, Element Six SDB1100, and Iljin Diamond ISD1700.

As used herein, a plurality of components may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, particle sizes, volumes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "about 1 micrometer to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

The Invention

It has been found that a heat spreader having a singular layer of diamond particles can provide an economical and effective mechanism for thermal management. The presence of a plurality of diamond particles arranged in a single layer with a single particle thickness within a heat spreader is a relatively easy and economical heat spreader design that is effective at thermal management when connected to a heat source. The plurality of diamond particles can be held in the mentioned single layer by the metallic mass that can cement the particles together. In some embodiments, substantially no diamond particles are present in the metallic mass beyond the single layer.

In accordance with embodiments presented herein, various details are provided which are applicable to each of the heat spreader, thermal management system, method of making a heat spreader, and method of transferring heat from a heat source. Thus, discussion of one specific embodiment is related to and provides support for this discussion in the context of the other related embodiments.

In one embodiment, the metallic mass is a single metallic material. Metallic is understood to include metals and metalloids (e.g. Si, B, Ge, Sb, As, and Te). In another embodiment, the metallic mass includes more than one metallic material. When the metallic mass includes more than one metallic material, they can be present in any configuration such as alloys, mixtures, separate layers or other spacial arrangements. In a specific embodiment, the heat spreader includes aluminum. In another embodiment, the metallic mass includes silicon. In further embodiments, the metallic mass can include both aluminum and silicon as an alloy and/or as a mixture. Selection of the material(s) to be used as the metallic mass should be made with special considerations in mind. The intended application may lead to the selection of a metallic material that is more electrically insulative or one that is more electrically conductive. Considerations for the selection also include malleability, cost, potential reactivity with the intended heat source, intended process conditions, and compatibility with other materials used (including any type of bonding agent).

To increase the thermal conductivity of the heat spreader, higher grade diamond particles can be used. The thermal conductivity of diamond grit is not necessarily higher than metallic materials, such as copper, if the diamond contains inclusions and other forms of defects. Diamond particles of better quality can transmit heat much faster than poorer-quality diamond particles. Thus, use of higher grade diamond particles increases the overall thermal conductivity of the heat spreader. Regularly-shaped diamonds may also increase the thermal conductivity of a heat spreader. As such, it may be desirable in some designs to include diamonds of regular shape. The diamond particles can be arranged so as to promote thermal conduction and transfer. To enhance thermal conduction and transfer, a diamond particle can be in direct physical contact with another diamond particle. Such contact is diamond-to-diamond contact. In one embodiment, substantially all diamond particles of a layer can be in diamond-to-diamond contact. Therefore, substantially all diamond particles in the heat spreader can be in direct physical contact with at least one other diamond particle. In yet another embodiment, substantially all diamond particles may be in contact with one or more diamond particles to the extent that a continuous diamond particle path way is provided for heat flow. In other words, all diamond particles are in substantial contact with the body or assembly of diamond particles provided. In an alternate embodiment, the diamond particles can be arranged or tiled in a two-dimensional pattern. In one example, the diamond particles can be substantially equidistant from each other. In a further embodiment, the tiled diamond particles can be in diamond-to-diamond contact. The diamond particles can be configured to have the same or similar orientations, which can further enhance the above embodiments, and thus improve thermal conductivity. In such embodiment, the tiling can be configured to minimize the gaps in between diamond particles. For example, substantially all diamond particles can have a face exposed from the heat spreader. Alternatively, the diamond particles can have a plane wherein all particles align on their faces. Where the diamond particles are of the same size, there may be two planes wherein the diamond particles align on their faces, i.e. a top and a bottom plane of the single diamond layer. Such layer can be partially exposed from the heat spreader in some embodiments, or may be substantially surrounded by non-diamond material, for example the metallic mass, or a combination of metallic mass with carbon material, for example polycrystalline diamond. Depending on cost of materials, labor costs, and anticipated use of the heat spreader, it may be useful to limit the single layer of diamond particles to smaller than the overall dimensions of the heat spreader. For example, diamond particles can be present in a layer and near one surface of a heat spreader, but not extend fully to the edges of the heat spreader.

Size can also affect the ability of diamond particles to transmit heat. Larger diamond particles perform much better than their smaller counterparts. Likewise, uniform diamond particles improve the ability of the single layer of diamond particles to transmit heat. As such, one embodiment of the present invention contemplates diamond particles that are substantially uniform in size. Although the size of the diamond particles can be of any size, in one embodiment, the diamond particles range in mesh size from about 10 to about 100. In a further embodiment, the diamond particles can be from about 20 mesh to about 70 mesh; and from about 30 mesh to about 50 mesh. In some aspects, particles of 30/40 mesh are used exclusively; in other aspects particles of 40/50 mesh are exclusively used. In a particular embodiment, coarser diamond particles can be used, such as those larger than about 60 mesh or larger than 80 mesh.

Although it is contemplated that the single diamond particle layer can be centrally located in the metallic mass, the layer is closer to one side of the metallic mass in one configuration. This design allows for the side of the metallic mass, which has the diamond layer closer to the surface, to be placed closer to the heat source. Thus, regions of the heat spreader proximate to a heat source can have a higher thermal conductivity than regions further away from the heat source.

In a further embodiment, the single layer of diamond particles can be cemented by the metallic mass on at least one side. Thus, the single layer of diamond particles can be held together in the heat spreader by the metallic mass, but can be at least partially exposed along a surface thereof. In such embodiment, the diamond particles can be veneered, or covered by a thin layer or even film of non-diamond material. Materials can be used to better distribute heat and thereby assist in the thermal conduction of the heat spreader. Further, the veneer material can be used to fasten or secure the heat spreader to a heat source. In one aspect, a thin metallic layer, for example from about 50 nm to about 200 nm can help bring the heat spreader into intimate contact with a heat source by securing the heat spreader to the heat source with minimal material separating the heat source from the diamond particles. A molten metallic material, for example including aluminum and/or silicon, can infiltrate and cement a single layer of diamond particles held initially by an organic adhesive. The organic adhesive can then be charred to form a veneer layer made of carbon. Still, another example of a carbon-material coated on the surface of exposed diamond particles is diamond like carbon. Such diamond like carbon can be coated on the diamond particles in a relatively thin layer, e.g. about 400 nm to about 700 nm. Diamond like carbon has a relatively high thermal conductivity and therefore enhances the overall thermal conductivity of the heat spreader.

In one aspect, the metallic mass can comprise or consist essentially of aluminum, silicon, copper, gold, silver, and alloys or mixtures thereof. In a detailed aspect, the metallic mass can include aluminum or silicon. In a further aspect, the metallic mass can consist essentially of aluminum. In an alternate aspect, the metallic mass can consist essentially of silicon. Further, the metallic mass can include a mixture or an alloy of aluminum and silicon. Further, an aluminum-magnesium alloy can be used, either exclusively, or in combination with other materials.

In a further aspect where the metallic mass comprises or consists essentially of aluminum, a portion of the aluminum can be anodized. Such anodizing can take place on one or more surfaces of the aluminum. In one embodiment, a heat spreader, including aluminum cementing a single layer of diamond particles, can have an anodized surface. The anodized surface can be parallel to the single diamond layer and can further, be on a portion of the heat spreader configured to be placed opposite a heat source. In a specific embodiment, the anodized surface can be placed between the layer of diamond particles and the heat source. In a more specific embodiment, the anodized surface can be placed in direct physical contact with the heat source. Further, the anodized surface can be physically attached and/or chemically bonded to the heat source.

Greater density of diamond particles within the single layer improves the ability of the heat spreader to transmit heat. Where the single layer is a single particle thick, the packing efficiency can be greatly improved over common methodologies for using diamond particles in heat spreaders. Packing efficiency can be somewhat conditional on the manufacturing conditions of the heat spreader (i.e. materials used, temperature, time, pressure). In one embodiment, the packing efficiency can be greater than about 50%. In a further embodiment, the packing efficiency can be greater than about 80%, and even greater than 90%. In still a further embodiment, the packing efficiency can be greater than about 95%. In the case of infiltration of the diamond particles at a lower pressure than is typically used for infiltration, in particular, the packing efficiency can range from about 50% to about 70%, or higher. Packing efficiencies can be improved by selecting larger diamond particles and particles of substantially uniform size and shape.

In yet another alternative embodiment, using uniformly shaped diamond particles can increase the packing efficiency. In particular, substantially cubic diamond particles are commercially available, although other shapes could be used. The cubic diamonds can be packed edge-to-edge in a single layer. The thermal properties of the final composite are improved if the particles are all oriented in the same direction as opposed to random directions.

One factor to consider in designing a heat spreader of the present invention is the thermal properties at the interfaces between diamond particles and the interfaces between metallic material and diamond particles. Empty voids between interfaces act as thermal barriers, i.e. commonly referred to as thermal contact resistance. Ideally, throughout the single layer, the sides of the diamond particles will have significant contact to other sides of diamond particles.

In some embodiments, the single layer of diamond particles is cemented by the metallic mass. Such cementing can be achieved in some aspects by infiltration with a metallic material. Appropriate infiltration temperatures can be determined based on the metallic material used to infiltrate. In one embodiment, the infiltration can occur at a temperature of less than about 800° C., although infiltration can occur at a variety of temperatures. The pressure for infiltration can also vary. The pressure can be lower pressure to comparative systems. Examples of the lower pressures includes less than about 100 atm, less than about 50 atm, less than about 10 atm, and less than about 5 atm. In one embodiment, the infiltration can occur under a vacuum.

The present invention encompasses devices, systems, and methods for transferring heat away from a heat source. In one aspect, a heat spreader can be included in a thermal management system. Such system can include a heat source in contact with a heat spreader. The heat spreader can have two oppositely located sides. The side closest to the heat source can have a lower coefficient of thermal expansion and a higher thermal conductivity than the opposite side. The thermal expansion and thermal conductivity properties can be affected by the location of the single layer of cemented diamond particles within the heat spreader. Specifically, the side of the heat spreader that includes the layer of diamond particles will exhibit lower thermal expansion and higher thermal conductivity.

The thermal properties of the diamond layer closer to one side of a heat spreader can be further accentuated by the addition of a polycrystalline diamond (PCD) layer. Such layer can be attached to the heat spreader and can be positioned between the heat spreader and the heat source. Furthermore, in some embodiments, a PCD layer can be in direct contact with the single layer of diamond particles. For example, in the case with the heat spreader having a diamond particles exposed on the surface of the heat spreader, a PCD layer can be attached directly to the diamond particles.

Heat spreaders made in accordance with the present invention can take a variety of configurations based on the intended use. The heat spreader made as described above can be polished and shaped based on the particular requirements of the heat source to which it will be applied. In contrast to heat spreaders utilizing CVD, the heat spreaders herein can be formed to almost any size relatively quickly. Most often for electronic applications, the heat spreader will be between about 0.1 mm and about 1 mm thick. In one aspect, the heat spreader can be a thickness of from about 1.1 to about 3 times the diamond layer thickness. The heat spreader may be formed into a circular or elliptical disk or a quadrilateral such as a square, rectangular or other shaped wafer. A benefit of the present design is the potential for great compactness in design. Also, the heat spreaders of the present invention can be formed into very large sizes, so as to cover a great amount of area, and can also be formed into potentially complicated shapes, depending on the desired application. The heat source can be any electrical or other component that produces heat (e.g. a CPU).

Once the heat spreader is formed, appropriate placement is based on design and heat transfer principles. The heat spreader can be in direct intimate contact with the component, and may even be formed to encompass or otherwise be contoured to provide direct contact with the heat source over a wide surface area. Alternatively, the heat spreader can be removed from the heat source by a heat conduit or other heat transfer device.

In addition to the heat spreader disclosed herein, the present invention encompasses a cooling unit for transferring heat away from a heat source. As shown in FIG. 1a, a heat spreader 12, formed in accordance with the principles discussed herein, can be disposed in thermal communication with both a heat source, such as a CPU 14, and a heat sink 16. The heat spreader transfers heat created by the CPU to the heat sink. The heat sink can be a number of heat sinks known to those of ordinary skill in the art including both the materials and configurations thereof. For example, aluminum and copper are well known for use as heat sinks, and as shown in FIG. 1a, can have a configuration that includes cooling fins 18. As heat is quickly and efficiently transferred from the CPU through the heat spreader, the heat sink absorbs the heat, and the cooling fins help dissipate the heat into the surrounding environment. A number of contact configurations between the heat sink, heat source, and heat spreader can be utilized depending on the specific results to be achieved. For example, the components may be disposed adjacent each other and can also be bonded or otherwise coupled to each other. In many circumstances, it may be beneficial to attach the heat spreader to the heat source. Such attachment can be by way of brazing, soldering, chemical bonding, gluing, or any other chemical or mechanical attachment means. A braze can conduct heat better than many other attachment materials, and therefore can add to the efficiency of the heat spreader.

While the heat sink 18 is shown in the figures as a sink including cooling fins, it is to be understood that the present invention can be utilized with any heat sink known to those in the art. Examples of known heat sinks are discussed in U.S. Pat. No. 6,538,892, which is herein incorporated by reference. In one aspect of the invention, the heat sink comprises a heat pipe having an internal working fluid. Examples of heat pipe heat sinks are discussed in U.S. Pat. No. 6,517,221, which is herein incorporated by reference.

Figure 1B:
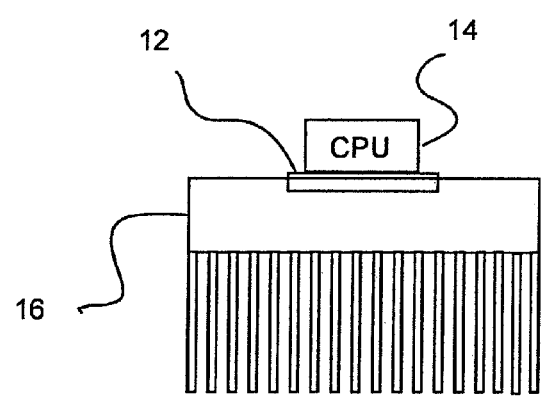
FIG. 1b is a schematic view of a heat spreader in thermal communication with a heat source and a heat sink in accordance with another embodiment of the present invention.

As shown in FIG. 1b, in one aspect of the invention, the heat spreader 12 can be at least partially embedded in the heat sink and/or the heat source. In this manner, not only is heat transferred from a bottom of the heat spreader to the heat sink, but heat is also at least partially transferred from sides of the heat spreader into the heat sink. After being embedded in the heat sink, the heat spreader can be bonded or brazed to the heat sink. In one aspect, the heat spreader can be held in the heat sink by a compression fit. In this manner, no bonding or brazing material exists between the heat spreader and the heat sink, which might act as a barrier to efficient heat transfer from the spreader to the sink.

While the heat spreader can be held in the heat sink by a variety of mechanisms known to those skilled in the art, in one aspect the heat spreader is held in the heat sink by a thermally induced compression fit. In this embodiment, the heat sink can be heated to an elevated temperature to expand an opening formed in the heat sink. The heat spreader can then be fitted into the expanded opening and the heat sink can be allowed to cool. Upon cooling, the heat sink, which has a relatively high coefficient of thermal expansion, will contract around the heat spreader and create a thermally induced compression fit that holds the heat spreader embedded within the heat sink without requiring any intervening bonding material. A mechanical friction fit can also be utilized to hold the heat spreader in the heat sink.

Figure 1C:
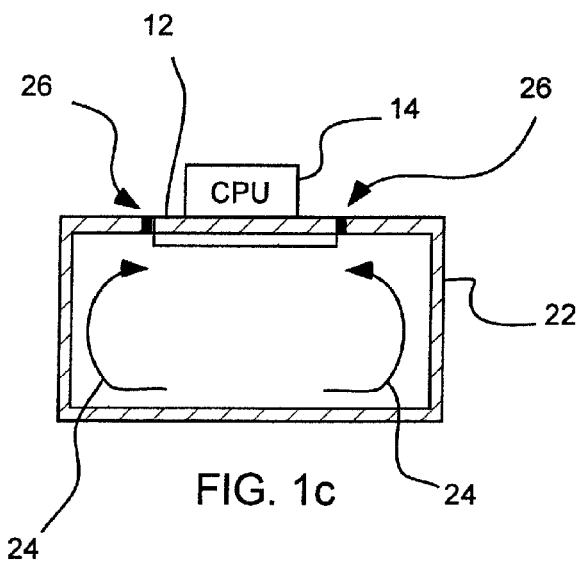
FIG. 1c is a schematic view of a heat spreader in thermal communication with a heat source and a heat sink in accordance with another embodiment of the present invention.

As shown in FIG. 1c, in one aspect of the invention, the heat sink can comprise a heat pipe 22 which can have an internal working fluid (not shown). The internal working fluid can be any known to those in the art, and in one aspect is water or water vapor. The heat pipe can be substantially sealed to maintain the working fluid within the heat pipe. The heat spreader can be disposed adjacent the heat pipe and in one aspect is brazed to the heat pipe. In the embodiment shown in FIG. 1c, the heat spreader protrudes through a wall of the heat pipe so that a bottom of the heat spreader is in direct contact with the working fluid. The heat spreader can be brazed within the heat pipe, as shown at 26, to assist in maintaining the substantially sealed condition of the heat pipe.

As the heat spreader is in direct contact with the working fluid, the working fluid can more efficiently transfer heat from the heat spreader. In the embodiment shown in FIG. 1c, the working fluid, in this case water (not shown), contacts the heat spreader and becomes vaporized as it absorbs heat from the heat spreader. The water vapor can then condense in liquid form on the bottom of the heat pipe, after which, due to capillary forces, the liquid will migrate 24 back up the walls of the heat pipe to the heat spreader, where it will again vaporize and repeat the cycle. As the walls of the heat pipe can be made of a material with a high coefficient of thermal conductivity, heat is dissipated from the walls of the heat pipe into the surrounding atmosphere.

Due to anticipated use, size, material, cost and other considerations, it may be advantageous to provide diamond like carbon (DLC) on the metallic mass. The DLC can be in the form of a layer physically and/or chemically attached one or more sides or surfaces of the metallic mass. The DLC can radiate heat from the heat spreader to the air more efficiently than a surface composed of the materials of the metallic mass. As such, the use of at least one DLC layer can be particularly advantageous in configurations that lack heat sinks. In one embodiment, the single layer of diamond particles can be located in the metallic mass at a location nearer the heat source and a DLC layer can be located on the metallic mass at a location opposite the heat source. In that configuration, heat energy would travel from the heat source, through the diamond particles (and possibly through an amount of metallic mass prior to the diamond particles), through a portion of the metallic mass, and dissipate from the DLC layer into the surroundings, e.g. air. Although the use of DLC can perhaps provide greater improvements in configurations without heat sinks, DLC layers can be utilized in some embodiments along with heat sinks DLC layers can also or alternatively be present on the metallic mass in at a location between the heat source and the single layer of diamond particles.

In accordance with the present invention, a method of making a heat spreader can include arranging a plurality of diamond particles in a single layer with a single particle thickness. Such layer is one particle thick. The single layer does not encompass layers wherein more than one particle is stacked on top of another particle, even in the situation where two smaller particles in a stacking arrangement are equal in height to a single, larger particle. The single layer can be encompassed with a metallic mass. The mass can be substantially free of other diamond particles, beyond those present in the single layer.

Figure 2:
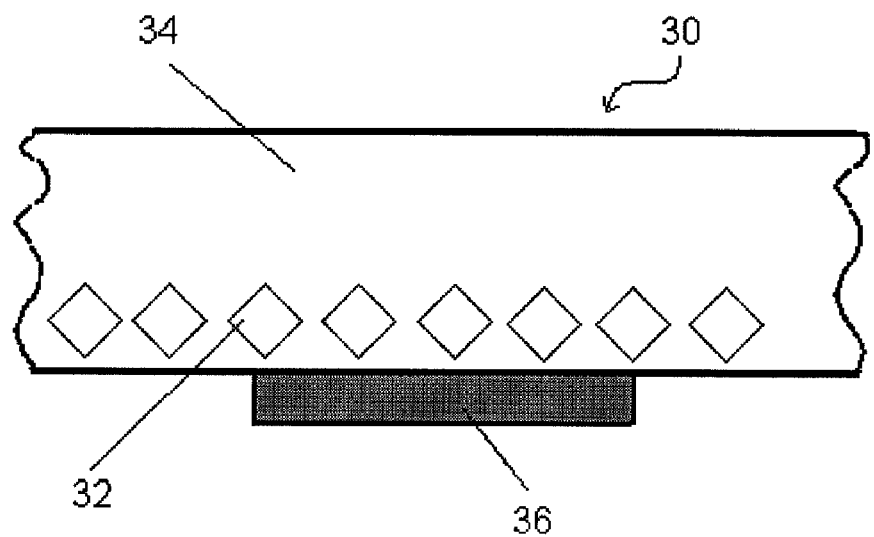
FIG. 2 is a side cross-sectional view of a heat spreader adjacent a heat source in accordance with an embodiment of the present invention.

FIG. 2 illustrates one embodiment of the present invention where the heat spreader 30 is in contact with the heat source 36. The heat source represented in the figure has a flat surface which makes for relatively easy thermal contact with a substantially flat heat spreader. As can be seen, the heat spreader includes a single layer of diamond particles 32. Encompassing the single layer of diamond particles is a metallic mass 34 which acts to cement the diamond particles in place.

Likewise, a method of transferring heat from a heat source can include drawing heat energy from a heat source and into a heat spreader, where the heat source and heat spreader are in thermal contact. More specifically, heat energy can be drawn into the diamond layer of a heat spreader and then conveyed into a metallic mass. Further, the heat spreader can be attached to a heat sink or heat pipe. Such attachment allows the heat energy to travel from the heat spreader (e.g. the metallic mass portion) to the heat sink or heat pipe.

The packing efficiency, and overall heat transfer properties of the single layer of diamond particles can be improved by using packing techniques. Such techniques typically include mechanical arrangement and/or agitation (e.g. vibration). As shown in the subsequent examples, a singular layer of diamond particles can be selected from a mass of free diamond particles by using a tacky or sticky layer or film to which a layer of diamond particles can stick. Such sticky layer can then be removed from the mass of free diamond particles, thus producing a single layer of diamond particles.

The single layer of diamond particles is encompassed by a metallic mass. Such encompassing can include introducing an interstitial material between at least a portion of the diamond particles. Interstitial material can be introduced through, among other processes, infiltrating the layer of diamond particles and electro-deposition. Interstitial material can be introduced into the diamond particle layer by electro-deposition (e.g., Ag, Cu, Ni) in a water solution. Substantially no chemical bonds are formed through this process, between the deposited metal and diamond. The metal is most often provided in an acid solution and may be performed by those skilled in this art. Various additional elements may also be added to lessen the surface tension of the solution or to otherwise improve infiltration into the voids.

Regarding infiltration, consideration should be given to how the processing conditions may adversely affect the diamond particles, the arrangement of the present invention makes the diamonds more robust than in other heat spreader configurations. Due to the single layer arrangement, infiltrating the diamond particles requires less time in processing conditions thus reducing exposure time for the diamond particles to potentially damaging conditions. Furthermore, using diamond particles of generally higher quality means that the diamond particles are less likely to be damaged by such aggressive processing, and are much less likely to back-convert. An additional consideration is that care must be taken in choosing an interstitial material so as to avoid an infiltration or sintering temperature that is high enough to damage the diamond. Therefore, in one aspect of the invention, the interstitial material can be an alloy that melts or sinters below about 1,100° C. When heating above this temperature, the time should be minimized to avoid excessive damage to the diamond particles. Damage to the diamond particles may also be induced internally due to cracking of the diamond from the site of metal inclusions. Synthetic diamonds almost always contain a metal catalyst (e.g., Fe, Co, Ni or its alloy) as inclusions. These metal inclusions have high thermal expansion coefficients and they can back-convert diamond into graphitic carbon. Hence, at high temperature, diamond can crack due to the different thermal expansion of metal inclusions or back-convert diamond to carbon. However, back-conversion can be substantially eliminated by infiltrating diamond under an ultrahigh pressure in the stability region of diamond, e.g., greater than about 5 GPa.

In order to minimize the diamond degradation, the infiltration can be preferably performed at a temperature below 1,100° C. or under high pressures in the stability region of diamond. Some of the Fe, Ni, and Co alloys and most of the Cu, Al and Ag alloys mentioned above have melting temperatures in this range. During infiltration of an interstitial material, the hot metal will inevitably cause some small degree of diamond degradation. However, this effect can be minimized by reducing the processing time and carefully choosing the interstitial material.

Figure 3:
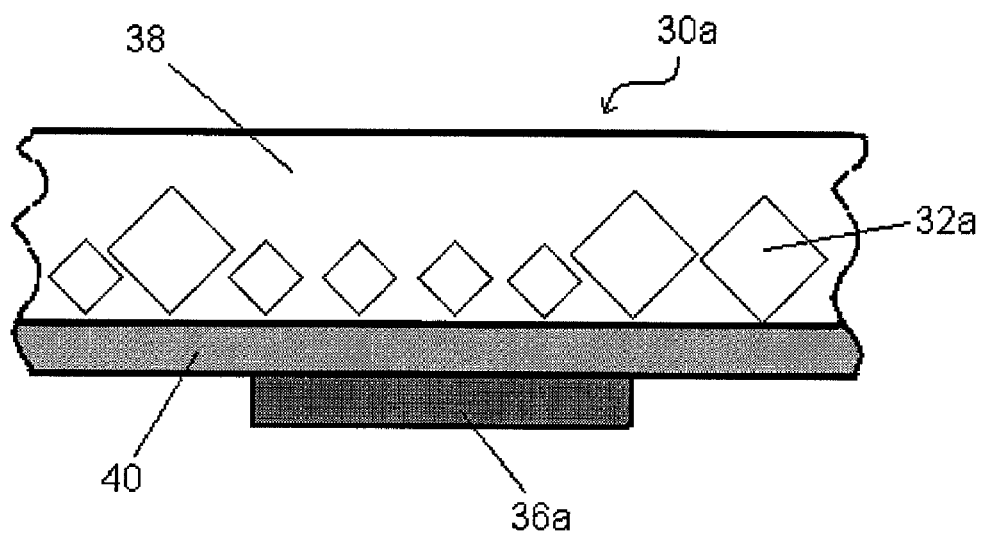
FIG. 3 is a side cross-sectional view of a heat spreader, including two different metallic materials, adjacent a heat source in accordance with another embodiment of the present invention.

As diamond may become damaged or back-convert under high temperature and high pressure conditions, in one embodiment, infiltrating can occur at a temperature of less than about 800° C. Likewise, infiltration can be performed under vacuum or reducing conditions. Using a vacuum or reducing atmosphere, such as hydrogen, can also prevent oxidation of the molten metallic material. Oxidation can reduce thermal conductivity of a metallic material, and is therefore, undesirable in the heat spreader. In one aspect, the single layer of diamond particles can be formed on a metallic substrate or film and a metallic material can then infiltrate the diamond particles. Such infiltration can bond to the metallic substrate or film, thus forming a solid heat spreader. The metallic substrate and the metallic infiltrating material can be the same or different materials. Such is the case illustrated in FIG. 3. Two separate layers of metallic material, 38 and 40, encompass the single layer of diamond particles 32a. The heat spreader 30a is in thermal contact with a heat source 36a. Specifically, the contact occurs between one layer of metallic material 40 and the heat source. The embodiment illustrated in FIG. 3 shows the diamond particles substantially encompassed in one of the metallic materials. Alternatively, the diamond particles can be encompassed in more than one metallic material. Furthermore, FIG. 3 illustrates diamond particles of varying sizes, as discussed previously. The singular layer is one diamond particle thick, which is distinct from diamond composite layers wherein diamonds are stacked throughout the thickness.

Figure 4:
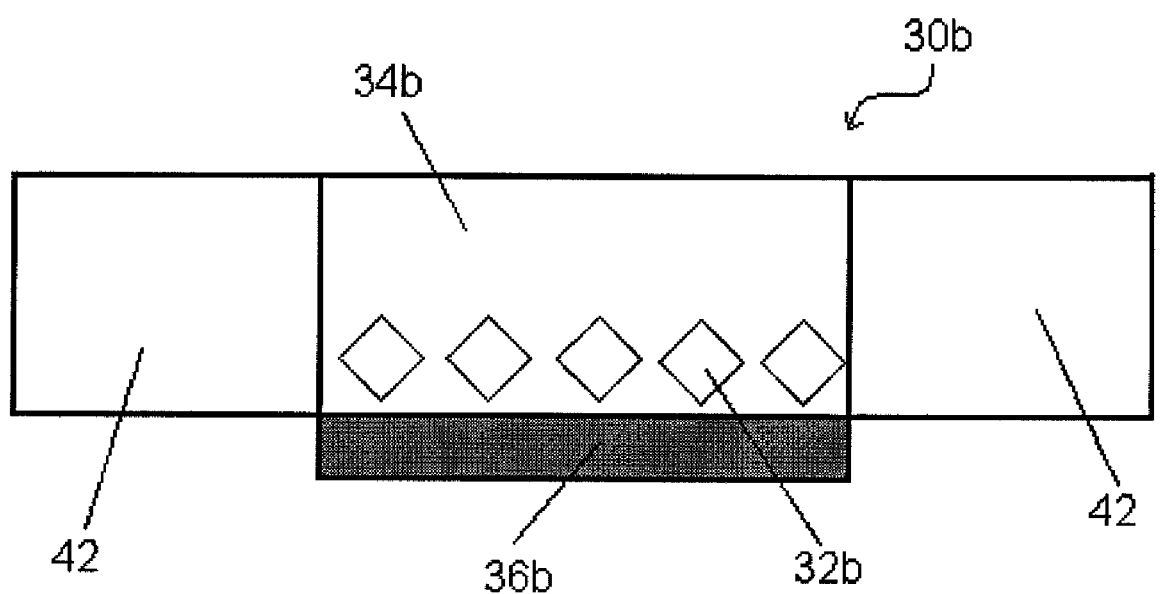
FIG. 4 is a side cross-sectional view of a heat spreader including a limited width single diamond layer in accordance with another embodiment of the present invention.

FIG. 4 illustrates a heat spreader 30b with a shortened diamond particle layer 32b. The diamond particle layer does not extend the full length of the heat spreader. Rather, it is limited in size to be approximately the same size as the heat source 36b. This configuration is a very economical one as the diamond particles tend to be the more expensive component of the heat spreader. This embodiment shows metallic material 42, which extends the heat spreader in blocks. The metallic material 42 can be the same as the metallic material 34b encompassing the diamond particle layer, or can be entirely different.

In one aspect, a heat spreader may be created including a single layer of diamond particles, wherein the single layer of diamond particles is along a surface of the heat spreader. The diamond particles can be cemented in place, and the heat spreader can include a metallic material, thus creating a difference in thermal conductivity of the heat spreader from one surface (the diamond particle layer) to an opposite surface (metallic material). The surface wherein at least some of the diamond faces or apexes are exposed can be connected to a heat source. Further, a layer of PCD may be attached to the single layer of diamond particles.

Thus has been presented heat spreaders, thermal management systems, methods of making such heat spreaders and methods of using the heat spreaders. Common heat spreaders which utilize diamond do so in more expensive and less-effective manner. Diamond films and layers created through CVD can be very time consuming and costly. Alternatively, some diamond-containing heat spreaders rely on diamond particles. However, these diamond particles are present in a composite, utilizing a great number of diamond particles throughout the composite. The previous designs relied on increasing the volume content of diamond to increase the thermal conductivity. Naturally, when using such a large number of diamond particles, lower grade diamonds are selected so as to lower the overall cost. Additionally, in one embodiment, the diamond particle layer is used strategically where it is needed most—the location of the hottest spot of the heat source. Using a limited number of strategically placed and higher quality diamond particles, ultimately reduces the overall cost of the heat spreader and provides a heat spreader with equal or greater capacity to transmit heat energy.

Further, the heat spreaders presented herein allow for a higher packing efficiency and easier manufacturing than previous designs. Intuitively, it is easier to pack diamond particles in singular layer than it is in a three-dimensional form as with diamond composites. It can be very difficult to pack diamond grits to reach ⅔ of the volume in three dimensions. Whereas, the single layer design allows for distinct particle packing and even particle orientation, which both act to increase the thermal conductivity of the heat spreader. Cementing and processing the single diamond layer requires less processing time to infiltrate and effective infiltration can be performed at a lower temperature and/or lower temperature, thus there it is less likely to damage the diamond particles through processing than with conventional diamond composite heat spreaders. By not damaging or straining the diamond particles through processing, the thermal conductivity of the particles is not reduced, as is often the case through conventional processing.

An additional benefit of the present design allows for better thermal connections between the heat spreader and the heat source. In the embodiments with the diamond layer closer to the heat source, the thermal expansion coefficient of the heat spreader is preferably designed for connections to the heat source and heat sinks. The thermal expansion coefficient is lower the diamond side and thus lower near the heat source, whereas it is higher near the heat sink or heat pipe. This is an ideal configuration that allows for long life of the connections. When there is a miss-match of thermal expansion, the repeated expansion and contraction due to heat variation will tend to crack and break attachments. Any crack or void between the heat source and the heat spreader can drastically reduce the effectiveness of the system. Likewise on the other side of the heat spreader with the connection with a heat sink or heat pipe. Typical diamond composites have a uniform or at least similar thermal expansion coefficient at both connections. The heat spreader presented herein, however, effectively bridges the thermal expansion gradient and provides for potential connections, which can endure much use and time.

The following examples present various methods for making the heat spreaders of the present invention. Such examples are illustrative only, and no limitation on the present invention is meant thereby.

EXAMPLES

Example 1

Method of Making a Heat Spreader

Figure 5A:
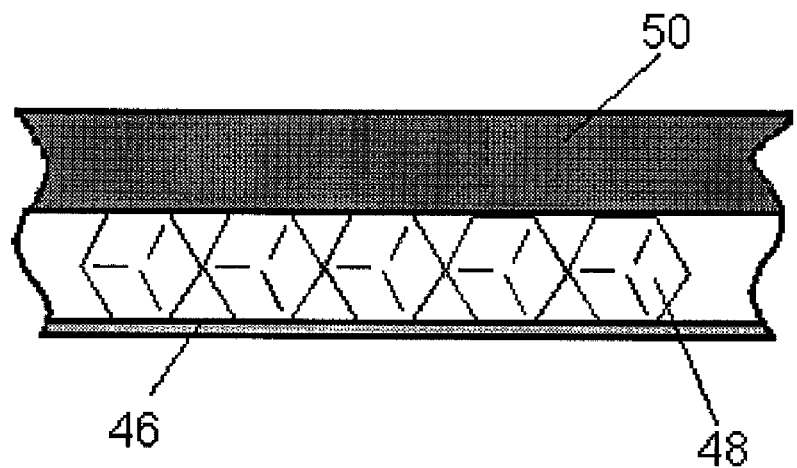
FIG. 5a is a side cross-sectional view of an exemplary initial step used for manufacturing heat spreaders, in connection with Example 1.
Figure 5B:
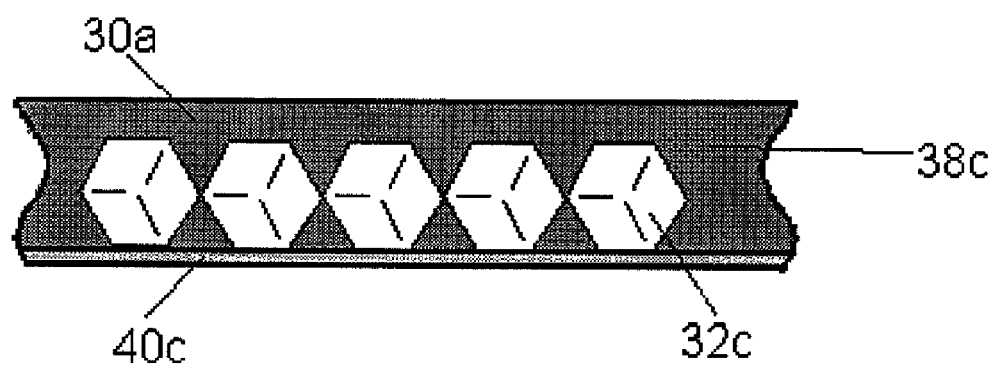
FIG. 5b is a side cross-sectional view of an exemplary heat spreader product of a manufacturing process, in connection with Example 1.

Diamond particles of 30/40 U.S. mesh (Element Six SDB1100) are thoroughly cleaned in acetone with ultrasonic vibration. A steel tray is fitted with a 100 micron film of deoxidized copper. A double sticking adhesive 25 microns thick is attached to the copper film. Diamond particles are spread onto the top of the adhesive layer and agitated by ultrasonic vibrations to increase the packing efficiency. The tray is overturned to discard diamond particles that are not stuck to the adhesive. Once loose particles are discarded, the tray is turned right side up again. A 2 mm thick plate of pure aluminum is placed on top of the diamond particles. The arrangement is illustrated in FIG. 5a, wherein the copper layer with adhesive 46 has a layer of diamond particles 48 covered by a plate of aluminum 50. The tray is then placed in a vacuum furnace and heated to 680° C. The aluminum infiltrates between the gaps of the diamond particles. The tray is allowed to cool. Upon cooling, the aluminum cements the diamond particles and is firmly bonded to the copper film. The resulting heat spreader product is shown as FIG. 5b, which is similar in design to FIG. 3.

Example 2

Method of Making Multiple Heat Spreaders

The process of Example 1 is followed, except that strips of copper are laid down over the adhesive layer prior to introducing diamond particles. The strips can be adjusted to create 20 mm squares of exposed adhesive.

Figure 6:
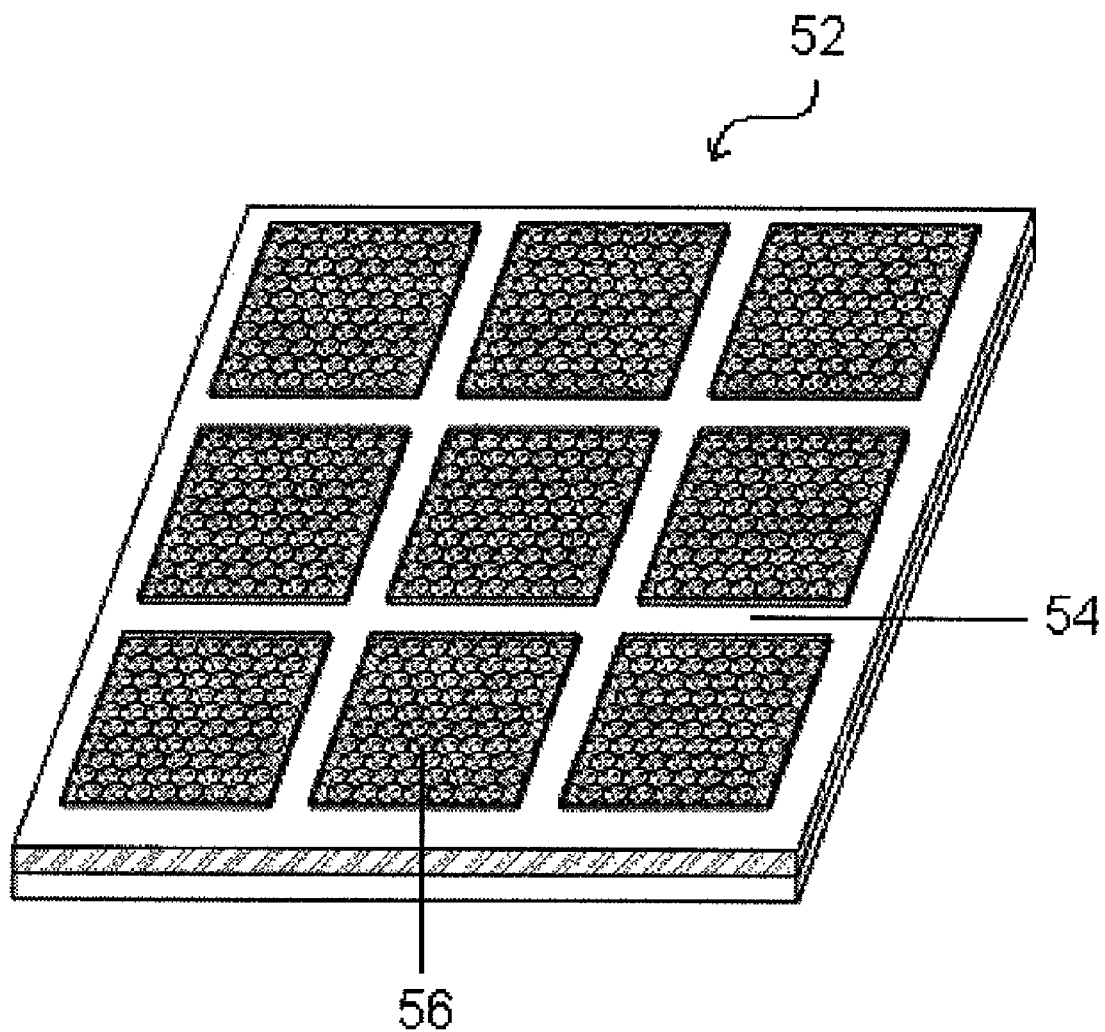
FIG. 6 is an overhead perspective view of an exemplary sheet of heat spreaders, in connection with Example 2.

Once the tray is allowed to cool, the aluminum top is ground smooth and the plate is wire-EDM cut along the middle lines of the copper stripe dividers. This produces multiple heat spreaders of about 40 mm. Each square contains about 1600 crystals (about 4 carats, at an approximate cost of 80 cents), with flat faces firmly embedded in the copper film. FIG. 6 illustrates an exemplary plate 52 of multiple heat spreaders prior to cutting, in accordance with the present example. The copper strips (covered with aluminum) 54, separate the individual heat spreaders 56 which include a single diamond layer.

Such heat spreaders can be soldered directly to a computer chip and/or soldered onto a heat sink or a heat pipe. The thermal conductivity in the diamond layer is about 1000 W/mK, which is approximately 2.5 times higher than that of copper. Such a high thermal conductivity can effectively eliminate the hot spots on a computer chip in real time. The heat is released on the other side of the diamond particles into the aluminum mass and further transmitted to a connected heat sink or heat pipe.

Example 3

Heat Spreader with Silicon

Same as Example 1, except molten silicon is used in place of aluminum, and infiltration is done at 1450° C. The final product is an electrical insulator as opposed to the electrically conductive copper. Additionally, the composite thermal expansion coefficient is smaller than in Example 1.

If excessive diffusion takes place at the interface of the infiltrant and the copper film, the thermal conductivity can be reduced. Additionally, the thin copper film can be dissolved. In this case, a flash of a more refractory metal can be coated on the copper film to become a chemical barrier. For example, tungsten can be sputtered onto the copper film. The thermal conductivity of tungsten is not low and it is very thin (e.g. nanometers), so the thermal resistance can be negligible.

Example 4

Heat Spreader with Silicon

Diamond particles of 30/40 U.S. mesh (Element Six SDB1100) are vibratory packed to form a single layer on an alumina plate with a rim. A Si wafer is placed on top of the packed diamond layer. The tray is placed in a vacuum furnace and heated to 1450° C. for 20 minutes. The Si is melted and fills in the voids among the diamond grains. The plate is allowed to cool. The cooled plate is ground on the surface to make it flat, and therefore easier for attachment to a heat source.

Example 5

Heat Spreader with Si—Al Alloy

Same as Example 4, except that the Si wafer is replaced by Si—Al alloy. Additionally, the infiltration is performed at 1000° C.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A heat spreader comprising:
a metallic mass having only a single layer of a plurality of diamond particles with a single particle thickness, said metallic mass cementing said diamond particles together and having substantially no other diamond particles therein.

2. The heat spreader of claim 1, wherein the metallic mass is a single metallic material.

3. The heat spreader of claim 1, wherein the metallic mass comprises more than one metallic material.

4. The heat spreader of claim 3, wherein the metallic mass includes multiple layers of different metallic materials.

5. The heat spreader of claim 1, wherein the metallic mass includes a metal alloy.

6. The heat spreader of claim 1, wherein the metallic mass includes a member selected from the group consisting of aluminum, silicon, copper, gold, silver, and alloys thereof.

7. The heat spreader of claim 6, wherein the metallic mass includes aluminum.

8. The heat spreader of claim 7, wherein the metallic mass includes aluminum-magnesium alloy.

9. The heat spreader of claim 7, wherein at least a portion of the aluminum is anodized.

10. The heat spreader of claim 6, wherein the metallic mass includes silicon.

11. The heat spreader of claim 6, wherein the metallic mass consists essentially of aluminum or silicon.

12. The heat spreader of claim 6, wherein the metallic mass includes a mixture or an alloy of aluminum and silicon.

13. The heat spreader of claim 1, wherein the diamond particles are high grade.

14. The heat spreader of claim 1, wherein the diamond particles are substantially uniform in size or shape.

15. The heat spreader of claim 1, wherein the mesh size of the diamond particles ranges from about 20 to about 70.

16. The heat spreader of claim 15, wherein the mesh size of the diamond particles ranges from about 30 to about 50.

17. The heat spreader of claim 1, wherein the single layer of diamond particles is closer to one side of the metallic mass than an opposite side.

18. The heat spreader of claim 1, wherein the packing efficiency of the single layer of diamond particles is greater than about 50%.

19. The heat spreader of claim 18, wherein the packing efficiency of the single layer of diamond particles is greater than about 80%.

20. The heat spreader of claim 1, wherein the thickness of the heat spreader is from about 1.1 to about 3 times the single particle thickness.

21. The heat spreader of claim 1, wherein the single layer of diamond particles is infiltrated with the metallic mass.

22. The heat spreader of claim 21, wherein the infiltration occurs at a temperature of less than about 800° C.

23. The heat spreader of claim 21, wherein the infiltration occurs under vacuum conditions.

24. The heat spreader of claim 23, wherein the infiltration occurs at pressures less than 100 atm.

25. The heat spreader of claim 1, further comprising a layer of polycrystalline diamond attached to a surface of the heat spreader.

* * * * *